United States Patent
Zhang et al.

(10) Patent No.: US 9,589,836 B1
(45) Date of Patent: Mar. 7, 2017

(54) METHODS OF FORMING RUTHENIUM CONDUCTIVE STRUCTURES IN A METALLIZATION LAYER

(71) Applicant: GLOBALFOUNDRIES Inc., Grand Cayman (KY)

(72) Inventors: Xunyuan Zhang, Albany, NY (US); Hoon Kim, Clifton Park, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/067,365

(22) Filed: Mar. 11, 2016

(51) Int. Cl.
| | |
|---|---|
| H01L 21/768 | (2006.01) |
| H01L 23/528 | (2006.01) |
| H01L 23/532 | (2006.01) |
| H01L 21/285 | (2006.01) |

(52) U.S. Cl.
CPC .. *H01L 21/76843* (2013.01); *H01L 21/28556* (2013.01); *H01L 21/28568* (2013.01); *H01L 21/7685* (2013.01); *H01L 21/76864* (2013.01); *H01L 21/76877* (2013.01); *H01L 23/528* (2013.01); *H01L 23/5329* (2013.01); *H01L 23/53209* (2013.01); *H01L 23/53238* (2013.01); *H01L 23/53266* (2013.01)

(58) Field of Classification Search
None
See application file for complete search history.

(56) References Cited

U.S. PATENT DOCUMENTS

| | | | | |
|---|---|---|---|---|
| 2005/0035460 A1* | 2/2005 | Tseng | ................ | H01L 21/76802 257/760 |
| 2013/0270703 A1* | 10/2013 | Zierath | ............. | H01L 21/76877 257/751 |
| 2014/0346674 A1* | 11/2014 | Bao | ................... | H01L 23/53276 257/741 |
| 2014/0357078 A1* | 12/2014 | Zhang | ............... | H01L 21/76814 438/669 |

* cited by examiner

*Primary Examiner* — Khaja Ahmad
(74) *Attorney, Agent, or Firm* — Amerson Law Firm, PLLC (57) ABSTRACT

One illustrative method disclosed herein includes, among other things, forming a first conductive structure and a second conductive structure that is conductively coupled to the first conductive structure. In this example, forming the second conductive structure includes forming a ruthenium cap layer on and in contact with an upper surface of the first conductive structure, with the ruthenium cap layer in position, forming a liner layer comprising manganese on and in contact with at least the surfaces of the second layer of insulating material, wherein an upper surface of the ruthenium cap layer is substantially free of the liner layer, and forming a bulk ruthenium material on and in contact with the liner layer, wherein a bottom surface of the bulk ruthenium material contacts the upper surface of the ruthenium cap layer.

15 Claims, 5 Drawing Sheets

METHODS OF FORMING RUTHENIUM CONDUCTIVE STRUCTURES IN A METALLIZATION LAYER

BACKGROUND OF THE INVENTION

1. Field of the Invention

Generally, the present disclosure relates to the manufacture of semiconductor devices, and, more specifically, to various methods of forming ruthenium conductive structures in a metallization layer.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reducing the physical size (feature sizes) of circuit elements, such as transistors. Field effect transistors (FETs) come in a variety of configurations, e.g., planar transistor devices, FinFET devices, nanowire devices, etc. Irrespective of the form of the FET, they have a gate electrode, a source region, a drain region and a channel region positioned between the source and drain regions. The state of the field effect transistor ("ON" or "OFF") is controlled by the gate electrode. Upon the application of an appropriate control voltage to the gate electrode, the channel region becomes conductive, thereby allowing current to flow between the source and drain regions.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level where the actual semiconductor-based circuit elements, such as transistors, are formed in and above the semiconductor substrate.

Typically, due to the large number of circuit elements and the required complex layout of modern integrated circuits, the electrical connections or "wiring arrangement" for the individual circuit elements cannot be established within the same device level where the circuit elements are manufactured. Accordingly, the various electrical connections that constitute the overall wiring pattern for the integrated circuit product are formed in one or more additional so-called "metallization layers" that are formed or stacked above the device level of the product. A typical integrated circuit product may contain several of such metallization layers, e.g., 7-12, depending upon the complexity of the integrated circuit product.

Each of these metallization layers is typically comprised of a layer of insulating material with conductive metal lines and/or conductive vias formed in the layer of material. Generally, the conductive lines provide the intra-level (i.e., within layer) electrical connections, while the conductive vias provide the inter-level connections or vertical connections between different metallization layers or levels. These conductive lines and conductive vias may be comprised of a variety of different materials, e.g., copper, with appropriate barrier layers, etc. The first metallization layer in an integrated circuit product is typically referred to as the "M1" layer, while the conductive vias that are used to establish electrical connection between the M1 layer and lower level conductive structures that physically contact the devices are typically referred to as "V0" vias. For current advanced integrated circuit products, the conductive lines and conductive vias in these metallization layers are typically comprised of copper, and they are formed in layers of insulating material using known damascene or dual-damascene techniques. As noted above, additional metallization layers are formed above the M1 layer, e.g., M2/V1, M3/V2, etc. Within the industry, conductive structures below the V0 level are generally considered to be "device-level" contacts or simply "contacts," as they contact the "device" (e.g., a transistor) that is formed in the silicon substrate.

However, with each advancing generation of products, the critical dimension of the conductive structures, e.g., the lateral width of a conductive line, tends to decrease as well. Filling relatively small trenches in a layer of insulating material with copper material, using electroplating or electroless plating techniques, can be difficult. Moreover, even though the overall critical dimension of these conductive structures decreases, the thickness of the barrier layer(s) that must be formed in these trenches remains about the same, i.e., the barrier layer thickness does not scale down (at least not significantly) as the overall critical dimension (lateral width) of the conductive structure, e.g., a conductive line, is reduced. Accordingly, there is less space within the trench for the more conductive copper material, i.e., the bulk metal of the conductive structure, and, in a relative sense, the current density within such smaller conductive structures increases during operation. In turn, this increase in current density of the bulk copper material can lead to more undesirable electromigration of the copper material during operation of the IC product, which can reduce product performance and/or lead to product failure.

Figure 1A:
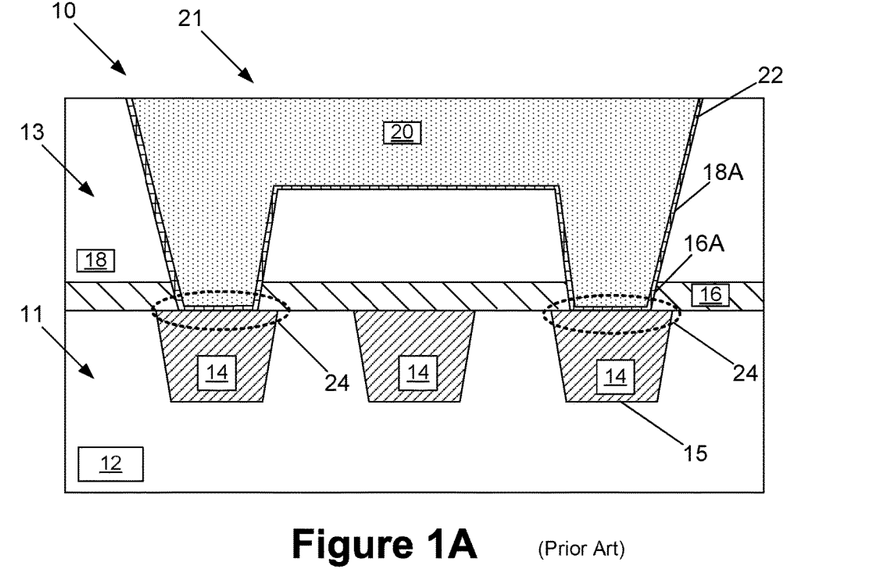
FIGS. 1A-1B depict one illustrative prior art method of forming conductive structures in a metallization layer on an integrated circuit product.
Figure 1B:
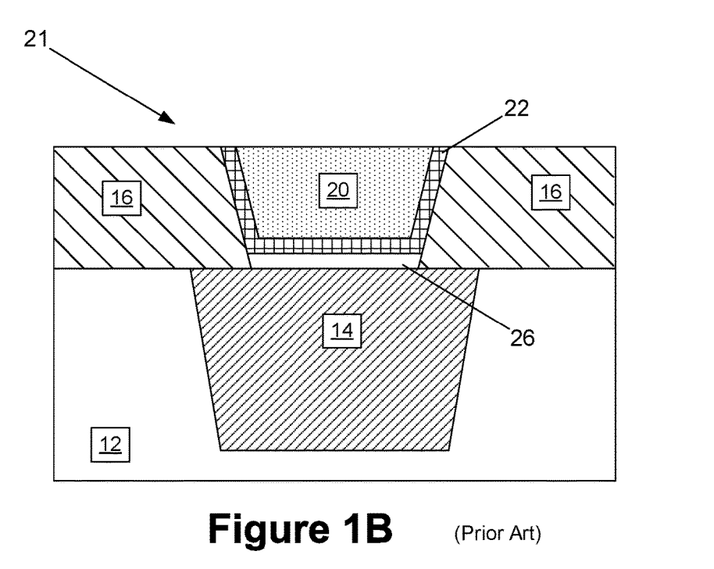

Investigations have been made with regard to using alternative materials, e.g., cobalt, ruthenium, etc., to replace copper as the bulk portion of the conductive structures. FIGS. 1A-1B depict one illustrative prior art method of forming conductive structures in a metallization layer on an integrated circuit product using such alternative materials. FIG. 1A is a simplified view of an illustrative metallization layer of a prior art integrated circuit product 10. At this point in the fabrication process, the product 10 comprises illustrative metallization layers 11 and 13. The metallization layers 11, 13 are typically formed during so-called BEOL (Back-End-Of-Line) processing operations. The metallization layer 11 comprises a layer of insulating material 12, a plurality of conductive structures 14, e.g., positioned in trenches 15 formed in the layer of insulating material 12, and an etch stop or cap layer 16. The metallization layer 13 comprises a layer of insulating material 18, a conductive structure 21 comprised of a conductive material 20 and one or more barrier/adhesion layers 22. The layers 12 and 18 may be comprised of a variety of different materials, e.g., a low-k material (k value of 3.3 or less), silicon dioxide, etc., and they may be formed to any desired thickness. The etch stop/cap layer 16 may be comprised of any of a variety of materials such as silicon nitride, silicon oxynitride, etc., and it may be formed to any desired thickness. The conductive structures 14 may be comprised of a variety of different materials e.g., copper, tungsten, cobalt, etc. The conductive structure 21 may be comprised of a conductive material 20 such as ruthenium or cobalt. The barrier/adhesion layer 22 may be comprised of one or more layers of various materials, such as titanium, titanium nitride, tantalum, tantalum nitride, etc. The material(s) selected for such barrier/adhesion layer(s) 22 may be based upon the material selected for the bulk metal material 20.

The conductive structure 21 may be formed by performing one or more etching processes to define an opening 18A in the layer of insulating material 18 and a plurality of openings 16A in the etch stop/cap layer 16. Each of the openings 16A exposes an upper surface of one of the conductive structures 14. Thereafter, the product was placed in a processing chamber and subject to an oxide cleaning process so as to remove any oxide materials (not shown), e.g., copper oxide, tungsten oxide, that may have been formed on the upper surfaces of the exposed conductive structures 14. Then, a deposition process was performed to deposit the barrier layer(s) 22 in the openings 16A, 18A and above the exposed conductive structures 14. Next, the conductive material 20 was formed on the product and a CMP process was performed so as to result in the final conductive structure 21.

FIG. 1B is an enlarged view of the portion of the conductive structure 21 depicted in the dashed-line region 24 in FIG. 1A. Unfortunately, using this prior art process flow, it may be the case that an interfacial oxide layer 26, e.g., copper oxide, tungsten oxide, etc., will be formed on or above the upper surface of the conductive structure 14. In the depicted example, the interfacial oxide layer 26 covers substantially the entire upper surface of the conductive structure 14, however, that may not be the case in all situations. The presence of the interfacial oxide layer 26 causes the electrical resistance of the overall wiring structure to increase, which can lead to a reduction in device performance.

The present disclosure is directed to various methods of forming ruthenium conductive structures in a metallization layer that may solve or at least reduce some of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming ruthenium conductive structures in a metallization layer. One illustrative method disclosed herein includes, among other things, forming a first conductive structure in a first layer of insulating material, the first conductive structure comprising an oxidizable metal material, and forming a second conductive structure that is conductively coupled to the first conductive structure, wherein at least a portion of the second conductive structure is positioned in a first opening in a second layer of insulating material comprising a carbon and oxygen-containing insulating material. In this example, forming the second conductive structure comprises forming a ruthenium cap layer on and in contact with an upper surface of the first conductive structure, with the ruthenium cap layer in position, forming a liner layer comprising manganese on and in contact with at least the surfaces of the second layer of insulating material defined by the first opening, wherein an upper surface of the ruthenium cap layer is substantially free of the liner layer, and forming a bulk ruthenium material on and in contact with the liner layer, wherein a bottom surface of the bulk ruthenium material contacts the upper surface of the ruthenium cap layer.

Also disclosed herein is a metallization system for an integrated circuit product. In one embodiment, the product comprises, among other things, a first conductive structure positioned in a first layer of insulating material, the first conductive structure comprising an oxidizable metal material, and a second conductive structure that is conductively coupled to the first conductive structure, wherein at least a portion of the second conductive structure is positioned in a first opening in a second layer of insulating material comprising a carbon and oxygen-containing insulating material. In this example, the second conductive structure comprises a ruthenium cap layer positioned on and in contact with an upper surface of the first conductive structure, a liner layer comprising manganese positioned on and in contact with at least the surfaces of the second layer of insulating material defined by the first opening, wherein an upper surface of the ruthenium cap layer is substantially free of the liner layer, and a bulk ruthenium material, at least a portion of the bulk ruthenium material being positioned within the first opening and on and in contact with the liner layer, wherein a bottom surface of the bulk ruthenium material contacts the upper surface of the ruthenium cap layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming conductive structures with different material compositions in a metallization layer. As will be readily apparent to those skilled in the art upon a complete reading of the present application, the methods disclosed herein may be employed when forming metallization layers that are electrically coupled to a variety of different semiconductor devices, e.g., transistors, memory cells, resistors, etc., and may be employed when forming metallization layers for a variety of different integrated circuit products, including, but not limited to, ASIC's, logic products, memory products, system-on-chip products, etc. With reference to the attached drawings, various illustrative embodiments of the methods disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 2A-2G depict one illustrative method disclosed herein for forming ruthenium conductive structures in a metallization system of an integrated circuit product 100. The product 100 may be any type of integrated circuit product that employs any type of a conductive structure, such as a conductive line or via, commonly found on integrated circuit products, including, but not limited to, logic products, memory products, system on chip products, etc.

Figure 2A:
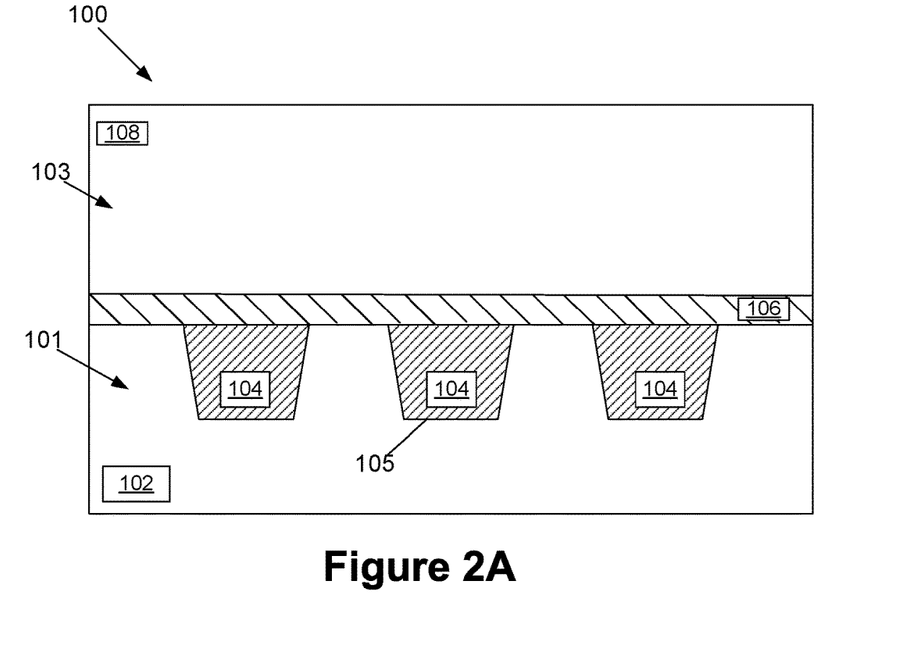
FIGS. 2A-2G depict one illustrative method disclosed herein for forming ruthenium conductive structures in a metallization system of an integrated circuit product.

FIG. 2A is a simplified view of illustrative metallization layers 101 and 103 that are formed for an integrated circuit (IC) product 100. The metallization layers 101, 103 depicted herein are intended to be representative of any metallization layer formed at any level on the product 100 (e.g., the M1 layer and/or any metallization layer formed above the M1 layer). The metallization layers 101, 103 are typically formed during so-called BEOL (Back-End-Of-Line) processing operations.

At the point of fabrication depicted in FIG. 2A, the metallization layer 101 comprises a layer of insulating material 102, a plurality of conductive structures 104, e.g., conductive metal lines, that are positioned in trenches 105 formed in the layer of insulating material 102, and an etch stop or cap layer 106. At this point in the process flow, the metallization layer 103 comprises a layer of insulating material 108. The layers 102 and 108 may be comprised of a variety of different materials, e.g., a low-k material (k value of 3.3 or less), silicon dioxide, etc., and they may be formed to any desired thickness. In one illustrative embodiment, the layers 102 and 108 may be comprised of a carbon and oxygen-containing insulating material, such as, for example, a carbon-doped low-k material (k value of 3.3 or less), a carbon-doped silicon dioxide, etc. However, the layers 102 and 108 need not both be formed of the same insulating material, but that may be the case in some applications. The etch stop/cap layer 106 may be comprised of any of a variety of materials such as silicon nitride, silicon oxynitride, etc., and it may be formed to any desired thickness, e.g., 5-15 nm.

The conductive structures 104 depicted herein are intended to be representative of any type of conductive structure that may be present in a metallization layer of an IC product. The conductive structures 104 may be of any desired size, shape or configuration. In some cases, one or more barrier/adhesion layers (not shown) may be formed in the trenches 105 prior to the formation of the bulk metal portion of the conductive structures 104. The barrier/adhesion layers may be comprised of a variety of different materials, e.g., one or more layers of titanium nitride, tantalum nitride, tantalum, titanium, etc. The material(s) selected for such barrier/adhesion layers may be based upon the material selected for bulk metal material that will be formed in the trenches 105 after the barrier/adhesion layers are formed in the trenches 105. The openings 105 may be formed using any of a variety of different processing techniques. In some applications, the conductive structures 104 may be formed using well-known single or dual damascene processing techniques. In other applications, the conductive structures 104 may be formed by depositing on or more metal layers and thereafter patterning those deposited metal layers. The conductive structures 104 may be comprised of a variety of different materials e.g., copper, tungsten, cobalt, etc. In one particular embodiment, the bulk metal portion of the conductive structures 104 may be comprised of a metal that oxidizes when it is exposed to an environment comprising oxygen during the IC manufacturing process, (e.g., the ambient environment within an IC product manufacturing facility) or at a temperature that falls within the range of about 25-400° C.

Figure 2B:
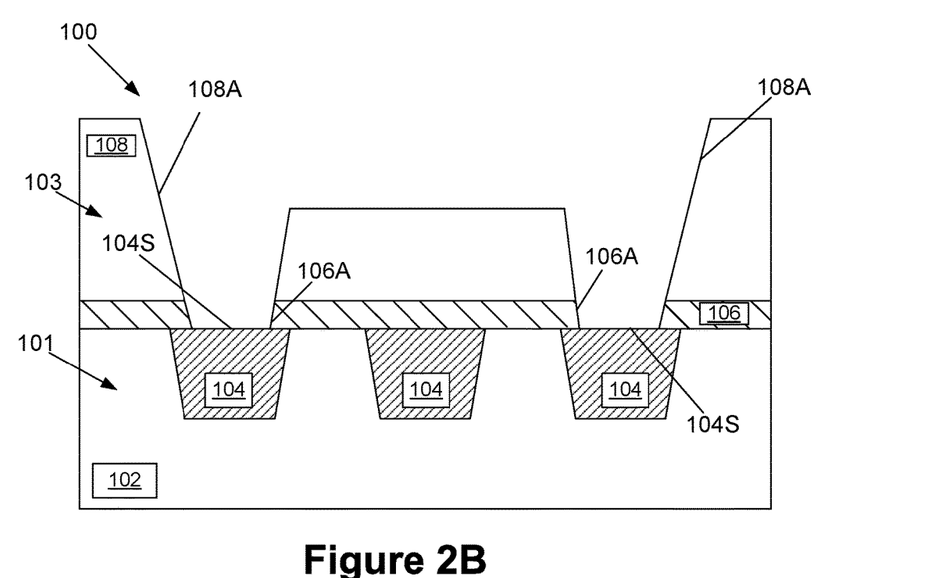

FIG. 2B depicts the product 100 after one or more etching processes were performed to define an opening 108A in the layer of insulating material 108 and a plurality of openings 106A in the etch stop/cap layer 106. Each of the openings 106A exposes an upper surface 104S of one of the illustrative conductive structures 104. The openings 108A, 106A may be formed using any of a variety of different processing techniques. In one particular process flow, a first etching process may be performed to define the opening 108A in the layer of insulating material 108, wherein the first etching process stops on the etch stop/cap layer 106. Thereafter, a second etching process may be performed though the opening 108A on the etch stop/cap layer 106 to define the openings 106A, wherein the second etching process stops on the conductive structures 104 positioned under the openings 106A. The openings 108A and 106A may be of any desired size, shape or configuration, and they, collectively, may expose one or more of the conductive structures 104.

Figure 2C:
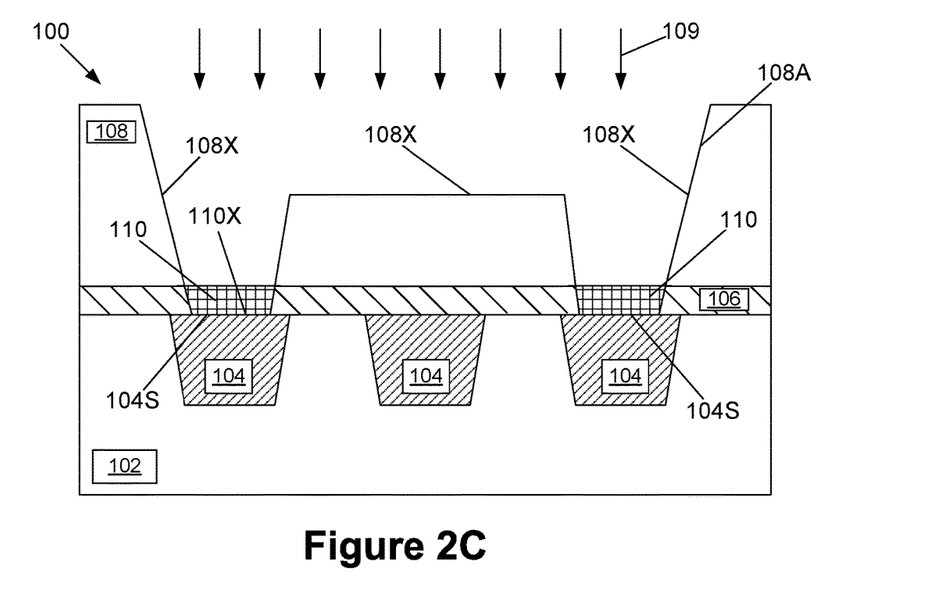

FIG. 2C depicts the product 100 after several process operations were performed. First, the product 100 was placed in a processing chamber and subject to an oxide cleaning process so as to remove any oxide materials (not shown), e.g., copper oxide, tungsten oxide, that may have been formed on the upper surfaces 104S of the exposed conductive structures 104 due to prior processing operations and/or due to exposure to an environment where such oxide materials may form. Then, a deposition process 109 was performed in a process chamber (not shown) in a substantially oxygen-free processing ambient to deposit a layer of ruthenium 110 selectively on the exposed conductive structures 104. Of course, in stating the layer of ruthenium 110 is selectively formed on the conductive structures 104, it does not mean that the layer of ruthenium 110 may not contact the etch stop layer 106 and/or the layer of insulating material 108 depending upon the thickness of the layer of ruthenium 110. The layer of ruthenium 110 may be considered to be a ruthenium cap layer for the conductive structures 104. More specifically, in one embodiment, the layer of ruthenium 110 is formed such that a bottom surface 110X of the layer of ruthenium 110 is deposited on and in contact with the upper surface 104S of the exposed conductive structures 104. The thickness of the layer of ruthenium 110 may vary depending upon the particular application, e.g., 5-15 nm. In the depicted example, the layer of ruthenium 110 was deposited to a thickness that is approximately the same as that of the etch stop/cap layer 106, although that need not be the case in all applications. The growth or formation of the ruthenium material of the layer 110 on the surfaces 108X of the layer of insulating material 108 (created by the formation of the opening 108A) is suppressed due to the hydrophobic nature of the carbon and oxygen-containing layer of insulating material 108, i.e., due to the presence of carbon and because nucleation of the ruthenium material 110 on the layer 108 is difficult to achieve.

Figure 2D:
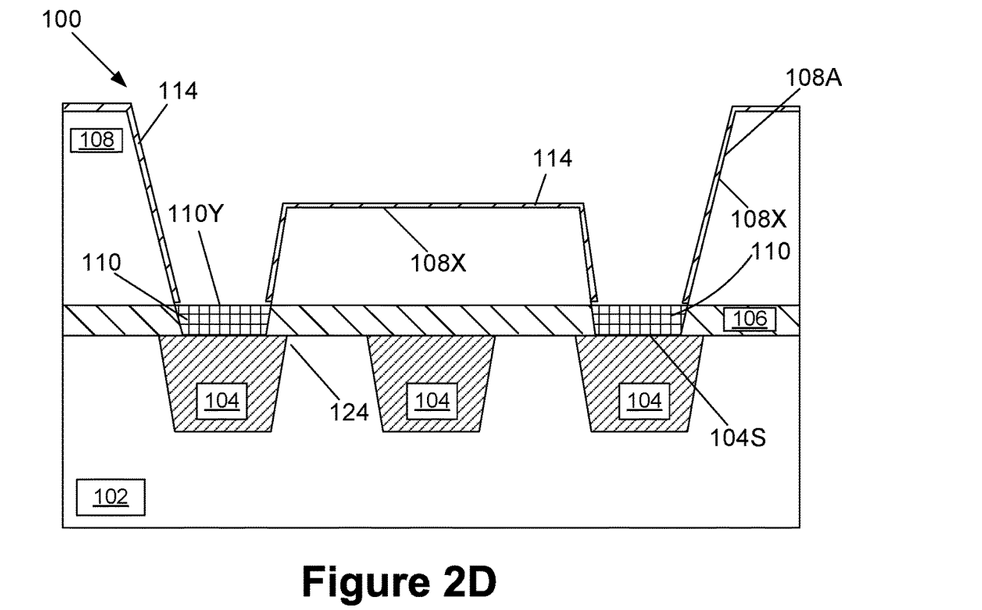

FIG. 2D depicts the product after several process operations were performed so as to selectively form a liner layer of manganese 114 on the surfaces 108X of at least the layer of insulating material 108. First, a conformal deposition process, e.g., ALD, CVD, etc., was performed to initially form the liner layer of manganese 114 on the surfaces 108X of the layer of insulating material 108. The thickness of the liner layer of manganese 114 may vary depending upon the particular application, e.g., 1-3 nm. During the deposition process, the liner layer of manganese 114 will be attracted to the oxygen in the carbon and oxygen-containing layer of material 108. After the formation of the liner layer of manganese 114, a first anneal process, e.g., an RTA (rapid thermal anneal) process, was performed on the product 100. The first anneal process may be performed at a temperature of about 400-500° C. and for a duration of about 30-600 seconds in an inert atmosphere. Accordingly, by performing these process operations, the manganese liner layer 114 will be selectively formed on the surfaces 108X of the layer of insulating material 108, while the upper surface 110Y of the ruthenium cap 110 will be substantially free of the manganese liner layer 114.

Figure 2E:
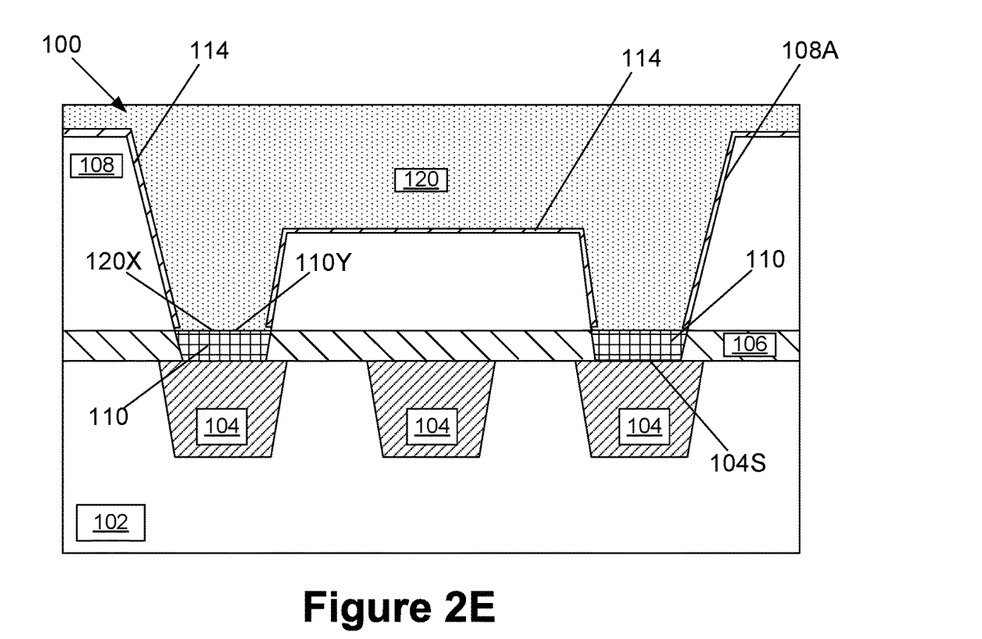

FIG. 2E depicts the product after several process operations were performed. First, a bulk ruthenium deposition process, e.g., a CVD or an ALD process, was performed so as to form bulk ruthenium material 120 that overfills the opening 108A. Thereafter, a second anneal process, e.g., an RTA (rapid thermal anneal) process, was performed on the product 100. The second anneal process may be performed at a temperature of about 400-500° C. and for a duration of about 30-600 seconds in a hydrogen-containing inert atmosphere. By performing the second anneal process, the grain structure of the initially deposited bulk ruthenium material 120 is modified, i.e., the size of the grain structure in the bulk ruthenium material 120 is increased, thereby reducing the electrical resistivity of the bulk ruthenium material 120. In one illustrative example, the bulk ruthenium material 120 is formed on and in contact with the manganese liner layer 114 and it is also formed such that the bottom surfaces 120X of the bulk ruthenium material 120 are formed on and in contact with the upper surface 110Y of the ruthenium cap layers 110 positioned above the conductive structures 104.

In one illustrative embodiment, the bulk ruthenium deposition process may be performed at a temperature that falls within the range of about 150-300° C. and a pressure that falls with the range of about 1 mTorr-10 Torr. The bulk ruthenium deposition process may be performed in a processing ambient with an oxygen partial pressure (i.e., oxygen exposure time) of at least about 0.02 Torr-seconds so that the bulk ruthenium material 120 has a relatively low resistance, e.g., in one embodiment less than about 10 μΩ-cm. During these process operations, the ruthenium cap 110 will act as a diffusion barrier layer preventing the diffusion of oxygen into the underlying conductive structure 104, thereby avoiding the formation of an interfacial oxide layer on the upper surface 104S of the conductive structure 104. Additionally, during these process operations, the liner layer of manganese 114 will attract oxygen and thereby further reduce the likelihood of an interfacial oxide layer being formed on the upper surface 104S of the conductive structure 104.

Figure 2F:
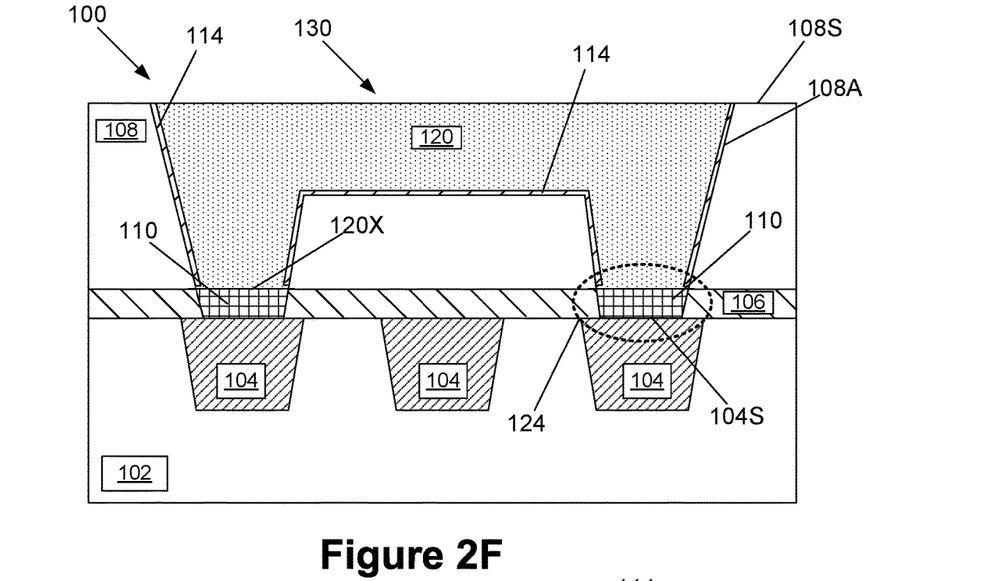

FIG. 2F depicts the product 100 after one or more chemical mechanical polishing (CMP) operations were performed to remove the excess amounts of the various materials positioned above the upper surface 108S of the layer of insulating material 108. These operations result in the formation of the finished conductive structure 130 that is positioned within the openings 106A, 108A and establishes electrical contact to the underlying conductive structures 104. Of course, the conductive structure 130 need not be formed so as to contact multiple numbers of the underlying conductive structures 104, but that situation may occur in some applications. In other applications, the conductive structure 130 may be formed so as to contact only a single one of the underlying conductive structures 104.

Figure 2G:
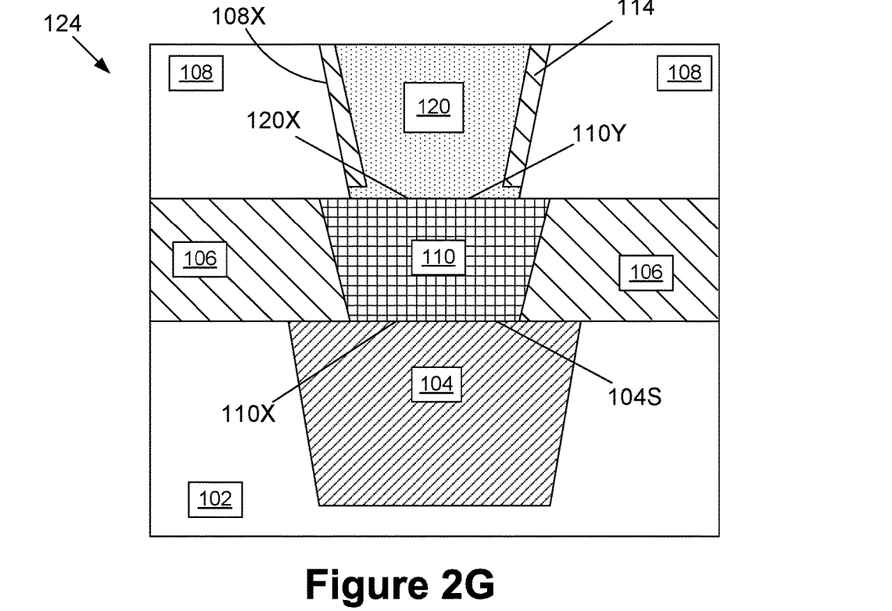

FIG. 2G is an enlarged view of the portion of the conductive structure 130 depicted in the dashed-line region 124 in FIG. 2F. As depicted, in performing one illustrative embodiment of the various methods disclosed herein, the manganese liner layer 114 may be selectively formed on the surfaces 108X of the layer of insulating material 108 while the upper surface 110Y of the ruthenium cap layer 110 remains substantially free of the manganese liner layer 114. Additionally, the bulk ruthenium material 120 may be formed on and in contact with the manganese liner layer 114 and the bottom surfaces 120X of the bulk ruthenium material 120 are formed on and in contact with the upper surface 110Y of the ruthenium cap layers 110 positioned above the conductive structures 104.

As will be appreciated by those skilled in the art after a complete reading of the present application, the various methods disclosed herein provide techniques whereby a conductive structure 130 comprised of a material such as ruthenium may be formed so as to establish electrical contact to one or more underlying conductive structures 104, wherein the conductive structures 104 are comprised of an oxidizable metal, such as copper, cobalt or tungsten. Thus, using the methods disclosed herein, a conductive structure 130, that may have a relatively low resistance, may be formed above such oxidizable conductive structures 104 while limiting or preventing the formation of a resistanceincreasing oxide layer on or above the upper surface 104S of the conductive structure 104, as was the case using the methods disclosed in the background section of this application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a first conductive structure in a first layer of insulating material, said first conductive structure comprising an oxidizable metal material; and
   forming a second conductive structure that is conductively coupled to said first conductive structure, wherein at least a portion of said second conductive structure is positioned in a first opening in a second layer of insulating material comprising a carbon and oxygen-containing insulating material, wherein forming said second conductive structure comprises:
      forming a ruthenium cap layer on and in contact with an upper surface of said first conductive structure;
      with said ruthenium cap layer in position, forming a liner layer comprising manganese on and in contact with at least surfaces of said second layer of insulating material defined by said first opening, wherein an upper surface of said ruthenium cap layer is substantially free of said liner layer; and
      forming a bulk ruthenium material on and in contact with said liner layer, wherein a bottom surface of said bulk ruthenium material contacts said upper surface of said ruthenium cap layer.

2. The method of claim 1, wherein said first conductive structure is a line structure and said first conductive structure comprises one of copper, tungsten or cobalt.

3. The method of claim 1, wherein said carbon and oxygen-containing insulating material comprises one of a carbon-doped silicon dioxide or a carbon-doped low-k (k value of less than 3.3) insulating material.

4. The method of claim 1, wherein forming said ruthenium cap layer comprises performing a chemical vapor deposition process or an atomic layer deposition process so as to selectively form said ruthenium cap layer on and in contact with said upper surface of said first conductive structure.

5. The method of claim 1, wherein forming said liner layer comprising manganese comprises performing a conformal deposition process and thereafter performing an anneal process.

6. The method of claim 1, wherein forming said bulk ruthenium material comprises performing a deposition process and thereafter performing an anneal process so as to form said bulk ruthenium material.

7. A method, comprising:
   forming a first conductive structure in a first layer of insulating material, said first conductive structure comprising an oxidizable metal material;
   forming an etch stop layer above said first conductive structure;
   forming at least one second layer of insulating material above said etch stop layer, said second layer of insulating material comprising a carbon and oxygen-containing insulating material;
   forming at least one first opening in said at least one second layer of insulting material and said etch stop layer so as to expose an upper surface of said first conductive structure within said at least one first opening;
   performing at least one first process operation so as to selectively form a ruthenium cap layer above said exposed upper surface of said first conductive structure;
   with said ruthenium cap layer in position, performing at least one second process operation so as to selectively form a liner layer comprising manganese on at least surfaces of said second layer of insulating material exposed by forming said at least one first opening; and
   performing at least one third process operation so as to form a bulk ruthenium material in said at least one first opening, wherein a bottom surface of said bulk ruthenium material contacts an upper surface of said ruthenium cap layer.

8. The method of claim 7, wherein forming said etch stop layer above said first conductive structure comprises forming said etch stop layer on and in contact with said upper surface of said first conductive structure, said etch stop layer comprising silicon nitride.

9. The method of claim 7, wherein performing said at least one first process operation comprises performing a chemical vapor deposition process or an atomic layer deposition process so as to as to selectively form said ruthenium cap layer on and in contact with said exposed upper surface of said first conductive structure.

10. The method of claim 7, wherein performing said at least one second process operation comprises performing a conformal deposition process and thereafter performing an anneal process so as to selectively form said liner layer comprising manganese on and in contact with at least surfaces of said second layer of insulating material exposed by forming said at least one first opening while not forming said liner layer comprising magnesium on an upper surface of said ruthenium cap layer.

11. The method of claim 7, wherein performing said at least one third process operation comprises performing a deposition process and thereafter performing an anneal process so as to form said bulk ruthenium material on and in contact with said liner layer comprising magnesium.

12. The method of claim 7, wherein said ruthenium cap layer has a thickness that is approximately the same as a thickness of said etch stop layer.

13. A metallization system of an integrated circuit product, comprising:
   a first conductive structure positioned in a first layer of insulating material, said first conductive structure comprising an oxidizable metal material; and
   a second conductive structure that is conductively coupled to said first conductive structure, wherein at least a portion of said second conductive structure is positioned in a first opening in a second layer of insulating material comprising a carbon and oxygen-containing insulating material, said second conductive structure comprising:
- a ruthenium cap layer positioned on and in contact with an upper surface of said first conductive structure;
- a liner layer comprising manganese positioned on and in contact with at least surfaces of said second layer of insulating material defined by said first opening, wherein an upper surface of said ruthenium cap layer is substantially free of said liner layer; and
- a bulk ruthenium material, at least a portion of said bulk ruthenium material being positioned within said first opening and on and in contact with said liner layer, wherein a bottom surface of said bulk ruthenium material contacts said upper surface of said ruthenium cap layer.

14. The product of claim 13, wherein said first conductive structure is a line structure and said first conductive structure comprises one of copper, tungsten or cobalt.

15. The product of claim 13, wherein said carbon and oxygen-containing insulating material comprises one of a carbon-doped silicon dioxide or a carbon-doped low-k (k value of less than 3.3) insulating material.

* * * * *